(12) United States Patent
Wang et al.

(10) Patent No.: US 10,727,739 B2
(45) Date of Patent: Jul. 28, 2020

(54) CHARGE PUMP CIRCUIT AND CONTROLLING METHOD THEREOF

(71) Applicant: Shenzhen Goodix Technology Co., Ltd., Shenzhen, Guangdong (CN)

(72) Inventors: Wen-Chi Wang, Guangdong (CN); Si Herng Ng, Guangdong (CN)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 16/798,413

(22) Filed: Feb. 23, 2020

(65) Prior Publication Data

US 2020/0195137 A1 Jun. 18, 2020

Related U.S. Application Data

(63) Continuation of application No. 16/452,456, filed on Jun. 25, 2019, now Pat. No. 10,615,688, which is a continuation of application No. PCT/CN2018/082867, filed on Apr. 12, 2018.

(51) Int. Cl.
*H02M 3/07* (2006.01)
*H02M 1/08* (2006.01)
*H03F 3/20* (2006.01)
*H03F 1/02* (2006.01)

(52) U.S. Cl.
CPC ............. *H02M 3/07* (2013.01); *H02M 1/08* (2013.01); *H03F 1/02* (2013.01); *H03F 3/20* (2013.01)

(58) Field of Classification Search
CPC ... H03F 3/20; H03F 3/21; H03F 3/213; H03F 1/02; H03F 1/0205; H03F 1/0211; H03F 1/0216; H03F 1/0244; H02M 1/08; H02M 3/07

USPC ......................................................... 327/536
See application file for complete search history.

(56) References Cited

U.S. PATENT DOCUMENTS

| | | | |
|---|---|---|---|
| 9,651,961 B2 | 5/2017 | Muthukaruppan | |
| 9,960,737 B1* | 5/2018 | Kovac | H03F 1/0266 |
| 10,199,928 B1* | 2/2019 | Wiedenbauer | H02M 3/158 |
| 2007/0030037 A1* | 2/2007 | Wang | G11C 27/024 |
| | | | 327/93 |

(Continued)

FOREIGN PATENT DOCUMENTS

| | | |
|---|---|---|
| CN | 203434861 U | 2/2014 |
| CN | 107846217 A | 3/2018 |
| TW | 201244328 A1 | 11/2012 |

*Primary Examiner* — Tomi Skibinski
(74) *Attorney, Agent, or Firm* — Winston Hsu

(57) ABSTRACT

The application provides a charge pump circuit, includes a digital control circuit, coupled to the switch module, configured to receive a up digital signal and a down digital signal, and adjust a first output voltage to a voltage level of an input voltage and adjust an second output voltage to a ground voltage level according to the up digital signal and the down digital signal; a digital-to-analog converter (DAC), configured to generate a corresponding up reference voltage and a corresponding down reference voltage according to the up digital signal and the down digital signal; and a voltage follower, comprising a plurality of operational amplifiers and a plurality of transistor switches, configured to lock the first output voltage and the second output voltage according to the up reference voltage and the down reference voltage; wherein the up digital signal and the down digital signal are varied with time.

20 Claims, 4 Drawing Sheets

(56) References Cited

U.S. PATENT DOCUMENTS

| | | | | |
|---|---|---|---|---|
| 2007/0046523 A1* | 3/2007 | Wang | .................... | H03M 1/66 |
| | | | | 341/172 |
| 2008/0116979 A1 | 5/2008 | Lesso | | |
| 2011/0084756 A1* | 4/2011 | Saman | .................... | H02M 3/07 |
| | | | | 327/536 |
| 2013/0057342 A1* | 3/2013 | Zhu | .................... | H03F 1/0222 |
| | | | | 330/127 |

* cited by examiner

CHARGE PUMP CIRCUIT AND CONTROLLING METHOD THEREOF

CROSS REFERENCE TO RELATED APPLICATIONS

This application is a continuation application of U.S. Ser. No. 16/452,456 filed on 2019 Jun. 25, which is a continuation application of international application No. PCT/CN2018/082867, filed on Apr. 12, 2018.

FIELD OF THE INVENTION

The present application relates to a charge pump circuit and controlling method thereof, and more particularly, to a charge pump circuit and controlling method thereof capable of reducing inrush currents generated when transforming among voltage modes.

BACKGROUND

Compared to a conventional class-AB amplifier, a class-G amplifier may be configured to dynamically adjust a power voltage and greatly improve power efficiency and is widely utilized in audio applications. Please refer to FIG. 1, which is a structural diagram of a conventional class-G amplifier circuit 10 with a digital input. The conventional class-G amplifier circuit 10 includes a digital front end circuit 102, a digital-to-analog converter (DAC) 104, a class-AB amplifier 106, a charge-pump control logic circuit 108 and a charge pump circuit 110. The charge-pump control logic circuit 108 adjusts an output voltage of the charge pump circuit 110 according to an input signal, such that the charge pump circuit 110 may transform among different voltage modes.

To avoid larger inrush currents generated when transforming modes, before the conventional charge pump circuit 110 is transformed from a ⅓VDD mode to a VDD mode, the conventional charge pump circuit 110 enters a soft ramp-up mode, an output voltage of the charge pump circuit 110 is charged by a smaller fixed current. After the charge pump circuit 110 is charged for a fixed time period, the charge pump circuit 110 enters the VDD mode. When the charge pump circuit 110 is transformed from the VDD mode to the ⅓VDD mode, a three-phase soft switching is utilized for transforming the output voltage to the ⅓VDD mode. However, a charging time period of the conventional charge pump circuit 110 is fixed during the soft ramp-up mode. If the charging period is not long enough, the charge pump circuit 110 enters the VDD mode and huge inrush currents are generated, which causes distortions when the class-G amplifier circuit is applied on the audio and generates pop noises. In contrast, if the charging period is too long, a ramp-up process of the output voltage is too slow and causes clipping of the output voltage of the class-G amplifier circuit and distortions. In addition, the charging time of the output voltage of the charge pump circuit 100 is easily affected by an output device and loading current, which makes digital control logic of the class-G amplifier circuit difficult. Moreover, a time period needed for the transformation to the ⅓VDD is directly related to the loading current and output capacitors. When the time period is too short, the output voltage of the charge pump circuit 100 cannot be reduced to the ⅓VDD mode. In contrast, if the time period is too long, the output voltage is lower than ⅓VDD due to a huge impedance caused by the soft switching of the charge pump circuit 100, which generates huge inrush currents.

Therefore, how to provide a charge pump circuit capable of minimizing the inrush currents during the mode transformations, so as to avoid circumstances of distortions caused by the pop noises or clipping and optimize the efficiency of the amplifier, has been an object in the industry.

SUMMARY

It is therefore an object of the present application to provide a charge pump circuit and controlling method to avoid circumstances of distortion caused by the generated pop noises or clipping and optimize the efficiency of the class-G amplifier circuit.

To solve the technical problems mentioned above, the present application provides a charge pump circuit, comprises a digital control circuit, coupled to the switch module, configured to receive a up digital signal and a down digital signal, and adjust a first output voltage to a voltage level of an input voltage and adjust an second output voltage to a ground voltage level according to the up digital signal and the down digital signal; a digital-to-analog converter (DAC), configured to generate a corresponding up reference voltage and a corresponding down reference voltage according to the up digital signal and the down digital signal; and a voltage follower, comprising a plurality of operational amplifiers and a plurality of transistor switches, configured to lock the first output voltage and the second output voltage according to the up reference voltage and the down reference voltage; wherein the up digital signal and the down digital signal are varied with time.

Preferably, the charge pump circuit further comprises a switch module, comprising a plurality of switches, a plurality of output capacitors, a loading resistor and a soft ramp-up switch, configured to generate the first output voltage and the second output voltage according to the input voltage.

Preferably, the charge pump circuit further comprises a balance release circuit, coupled to the digital control circuit and the switch module, configured to maintain a common mode voltage of the first output voltage and the second output voltage at a fixed value through a common mode feedback loop, when the first output voltage and the second output voltage is discharging or charging; wherein the common mode voltage is half of the input voltage; wherein the common mode feedback loop includes a plurality of operational amplifiers and a plurality of resistors.

Preferably, the switch module receives a digital control signal to control the plurality of switches and the soft ramp-up switch to transform the first output voltage and the second output voltage with a first mode, a ramp-up mode, a second mode and a balance release mode.

Preferably, when the charge pump circuit is transformed from the first mode to the ramp-up mode, the first output voltage is adjusted to the voltage level of the input voltage according to the up reference voltage and the second output voltage is adjusted to the ground voltage level according to the down reference voltage.

Preferably, when the charge pump circuit is transformed from the ramp-up mode to the second mode, the plurality of transistor switches of the digital control circuit are turned on to connect the input voltage and the ground voltage level to enter the second mode.

Preferably, the first output voltage and the second output voltage are only related to the up reference voltage and the down reference voltage.

Preferably, the digital control circuit is connected to the first output voltage and the second output voltage.

Preferably, when the charge pump circuit is transformed from the second mode to the balance release mode, the first output voltage is discharged and the second output voltage is charged by the loading resistor and the plurality of capacitors, the common mode voltage of the first output voltage and the second output voltage is maintained at the fixed value by the common mode feedback loop of the balance release circuit.

Preferably, when the charge pump circuit is transformed from the second mode to the balance release mode, a switching operation of the plurality of switches of the switch module is stopped, and a switch of the common mode feedback loop is turned on.

Preferably, the fixed value is half of the input voltage.

Preferably, when the first output voltage and the second output voltage are completely discharged, the charge pump circuit is transformed from the balance release mode to the first mode.

Preferably, when the first output voltage is determined smaller than $2/3$ of the input voltage or when the second output voltage is determined larger than $1/3$ of the input voltage by a logic circuit, a voltage level of a logic signal is changed; the charge pump circuit is transformed from the balance release mode to the first mode according to a variation of the voltage level of the logic signal; and a charge pump controller is notified by the logic signal.

Preferably, the charge pump controller is configured to output the up digital signal and the down digital signal.

Preferably, when the charge pump circuit is transformed from the balance release mode to the first mode, the first output voltage is $2/3$ of the input voltage and the second output voltage HPVSS is $1/3$ of the input voltage, so as to achieve a stable state voltage of the first mode.

An embodiment of the present application provides a controlling method for a charge pump circuit, comprises receiving a up digital signal and a down digital signal; converting the up digital signal and the down digital signal to a up reference voltage and a down reference voltage; adjusting a first output voltage to a voltage level of an input voltage and an second output voltage to a ground voltage level according to the up reference voltage and the down reference voltage; turning on a plurality of transistor switches of the digital control circuit of the charge pump circuit to connect the input voltage and a ground voltage level; discharging the first output voltage and charging the second output voltage by a loading resistor and a plurality of capacitors; and maintaining a common mode voltage of the first output voltage and the second output voltage at a fixed value by a common mode feedback loop.

The charge pump circuit of the present application locks the output voltage of the charge pump circuit according to the input signal to reduce inrush currents during the mode transformation, so as to avoid circumstances of distortions caused by pop noises or clipping generated by the class-G amplifier circuit. In addition, since the energy discharged by the charge pump circuit is completely consumed on the loading resistor in the balance release mode, which is more capable of optimizing the efficiency of the class-G amplifier circuit compared with the soft switching mode of the conventional charge pump circuit.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present application become more apparent, the following relies on the accompanying drawings and embodiments to describe the present application in further detail. It should be understood that the specific embodiments described herein are only for explaining the present application and are not intended to limit the present application.

Figure 1:
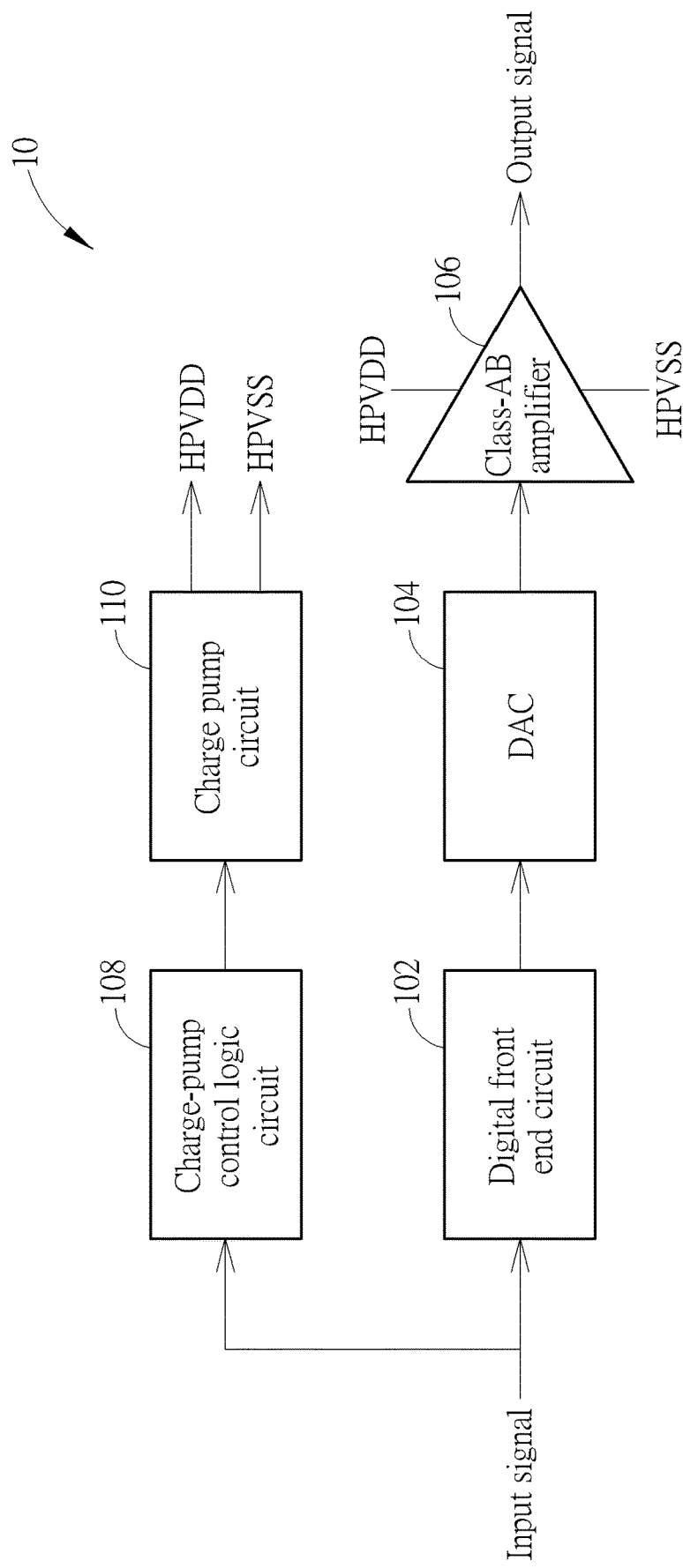
FIG. 1 is a schematic diagram of a conventional class-G amplifier.
Figure 2:
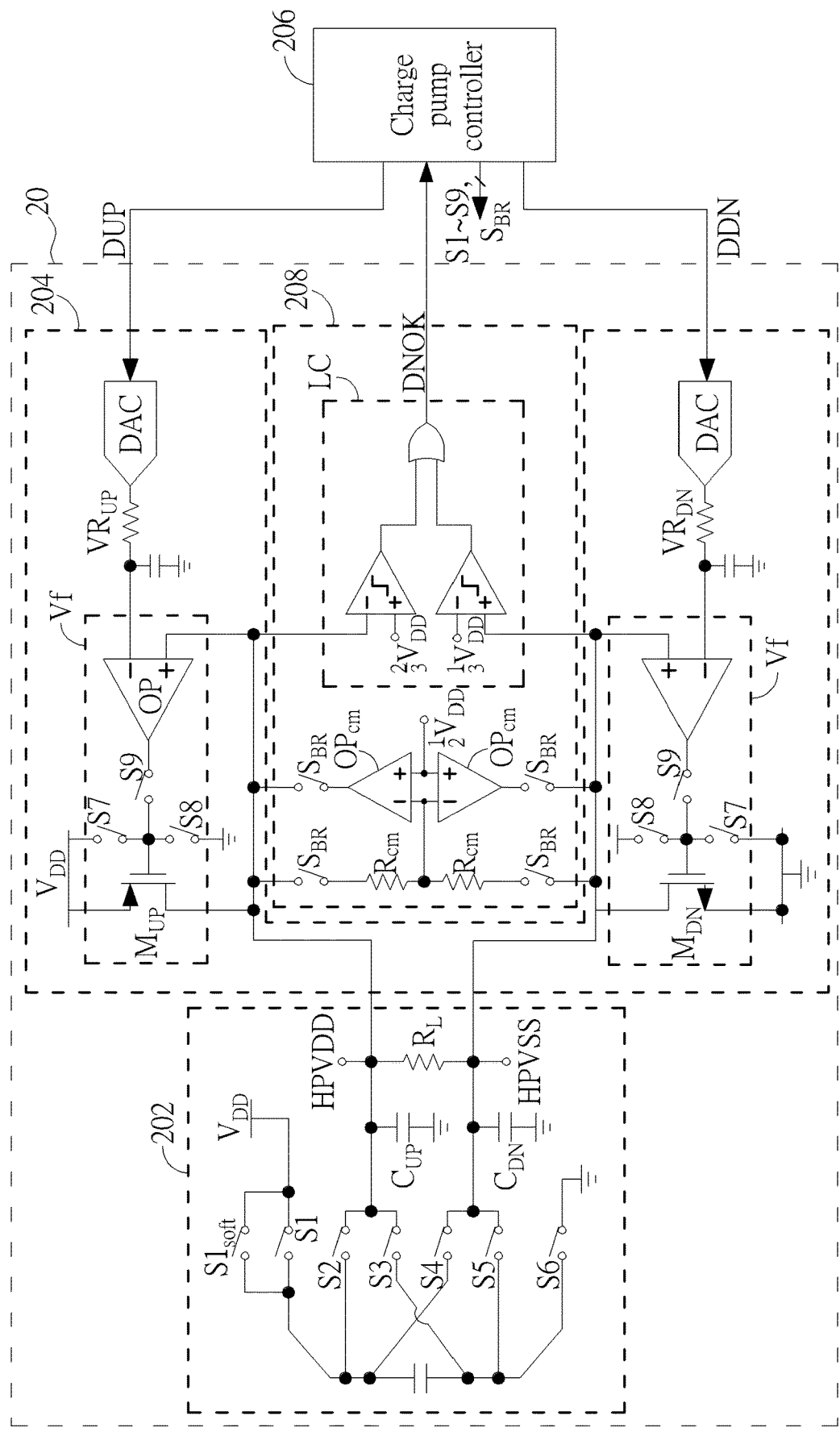
FIG. 2 is a schematic diagram of a charge pump circuit according to an embodiment of the present application.

Please refer to FIG. 2, which is a schematic diagram of a charge pump circuit 20 according to an embodiment of the present application. The charge pump circuit 20 includes a switch module 202, a digital control circuit 204 and a balance release circuit 208. The switch module 202 is configured to generate a first output voltage HPVDD and a second output voltage HPVSS according to an input voltage VDD, which includes switches S1, S2, S3, S4, S5, S6, output capacitors $C_{UP}$, $C_{DN}$, a loading resistor RL and a soft ramp-up switch $S1_{soft}$. The digital control circuit 204 is configured to lock the first output voltage HPVDD and the second output voltage HPVSS. The balance release circuit 208 is configured to maintain a common mode voltage of the first output voltage and the second output voltage at $V_{cm}$ through a common mode feedback loop, when the first output voltage HPVDD and the second output voltage HPVSS is discharging or charging. A charge pump controller 206 is configured to output an up digital signal $D_{UP}$ and a down digital signal $D_{DN}$, and adjust the first output voltage HPVDD to a voltage level of the input voltage VDD, and adjust the second output voltage HPVSS to a voltage level of GND. In addition, the charge pump controller 206 is configured to determine whether a mode transformation process of the charge pump circuit 20 is completed or not according to a logic signal DNOK. Therefore, the charge pump circuit 20 of the present application locks the first output voltage HPVDD and the second output voltage HPVSS of the switch module 202 by the digital control circuit 204 and the balance release circuit 208, so as to reduce inrush currents generated during the mode transformation of the charge pump circuit 20 and consume all discharged energy on the loading resistor to increase the power efficiency of the charge pump circuit 20.

In detail, the digital control circuit 204 includes a digital-to-analog converter DAC and a voltage follower Vf, wherein the digital-to-analog converter DAC is configured to generate a corresponding up reference voltage $VR_{UP}$ and a corresponding down reference voltage $VR_{DN}$ according to the up digital signal $D_{UP}$ and the down digital signal $D_{DN}$. The voltage follower Vf includes switches S7, S8, S9, an operational amplifier Op and transistor switches $M_{UP}$, $M_{DN}$ to lock the first output voltage HPVDD and the second output voltage HPVSS respectively according to the up reference voltage $VR_{UP}$ and the down reference voltage $VR_{DN}$. Notably, since the up reference voltage $VR_{UP}$ is generated by the up digital signal $D_{UP}$, and the down reference voltage $VR_{DN}$ is generated by the down digital signal $D_{DN}$, variation speeds of the first output voltage HPVDD and the second output voltage HPVSS are dynamically varied in time according to the input signal of the class-G amplifier circuit

10. That is, the first output voltage HPVDD is only related to the up reference voltage $VR_{UP}$ in an ascending process, and the second output voltage HPVSS is only related to the down reference voltage $VR_{DN}$ in a descending process, so as to avoid clipping of the class-G amplifier circuit 10 because the first output voltage HPVDD and the second output voltage HPVSS are incapable of varying in time. The balance release circuit 208 includes a logic circuit LC and the common mode feedback loop, wherein the common mode feedback loop includes a common mode operational amplifier $OP_{cm}$, a switch $S_{BR}$ and a common mode resistor $R_{cm}$, so as to detect a common mode voltage $V_{cm}$ when the first output voltage HPVDD and the second output voltage HPVSS are freely discharged or charged and maintain an average value of the first output voltage HPVDD and the second output voltage HPVSS at VDD/2 by a feedback control. When the first output voltage HPVDD is smaller than 2*VDD/3 or when the second output voltage HPVSS is larger than VDD/3, which represents that the first output voltage HPVDD and the second output voltage HPVSS are completely discharged or charged, the logic signal DNOK of the balance release circuit 208 is changed from a low voltage level (DNOK=LOW) to a high voltage level (DNOK=HIGH) and the charge pump controller 206 is notified.

Figure 3:
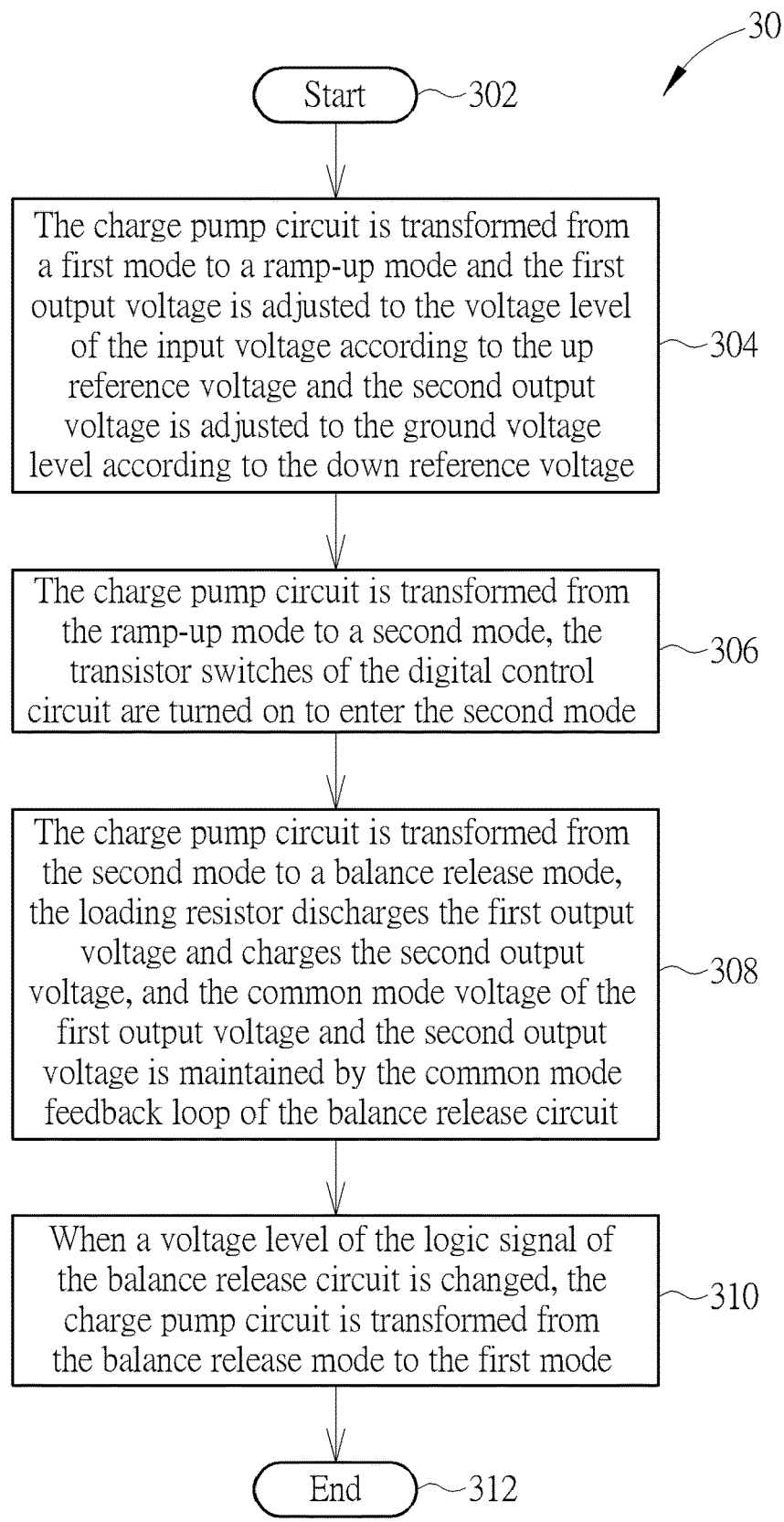
FIG. 3 is a flow chart of a controlling method according to an embodiment of the present application.

Regarding an operation method of the charge pump circuit 20, please refer to FIG. 3, which is a flow chart of a controlling method according to an embodiment of the present application. The controlling method 30 includes the following steps:

Step 302: Start.

Step 304: The charge pump circuit 20 is transformed from a first mode (⅓VDD mode) to a ramp-up mode and the first output voltage HPVDD is adjusted to the voltage level of the input voltage VDD according to the up reference voltage $VR_{UP}$ and the second output voltage HPVSS is adjusted to the ground voltage level according to the down reference voltage $VR_{DN}$.

Step 306: The charge pump circuit 20 is transformed from the ramp-up mode to a second mode (VDD mode), the transistor switches of the digital control circuit 204 are turned on to enter the second mode.

Step 308: The charge pump circuit 20 is transformed from the second mode to a balance release mode, the loading resistor RL discharges the first output voltage HPVDD and charges the second output voltage HPVSS, and the common mode voltage $V_{cm}$ of the first output voltage HPVDD and the second output voltage HPVSS is maintained by the common mode feedback loop of the balance release circuit 208.

Step 310: When a voltage level of the logic signal DNOK of the balance release circuit 208 is changed, the charge pump circuit 20 is transformed from the balance release mode to the first mode.

Step 312: End.

Figure 4:
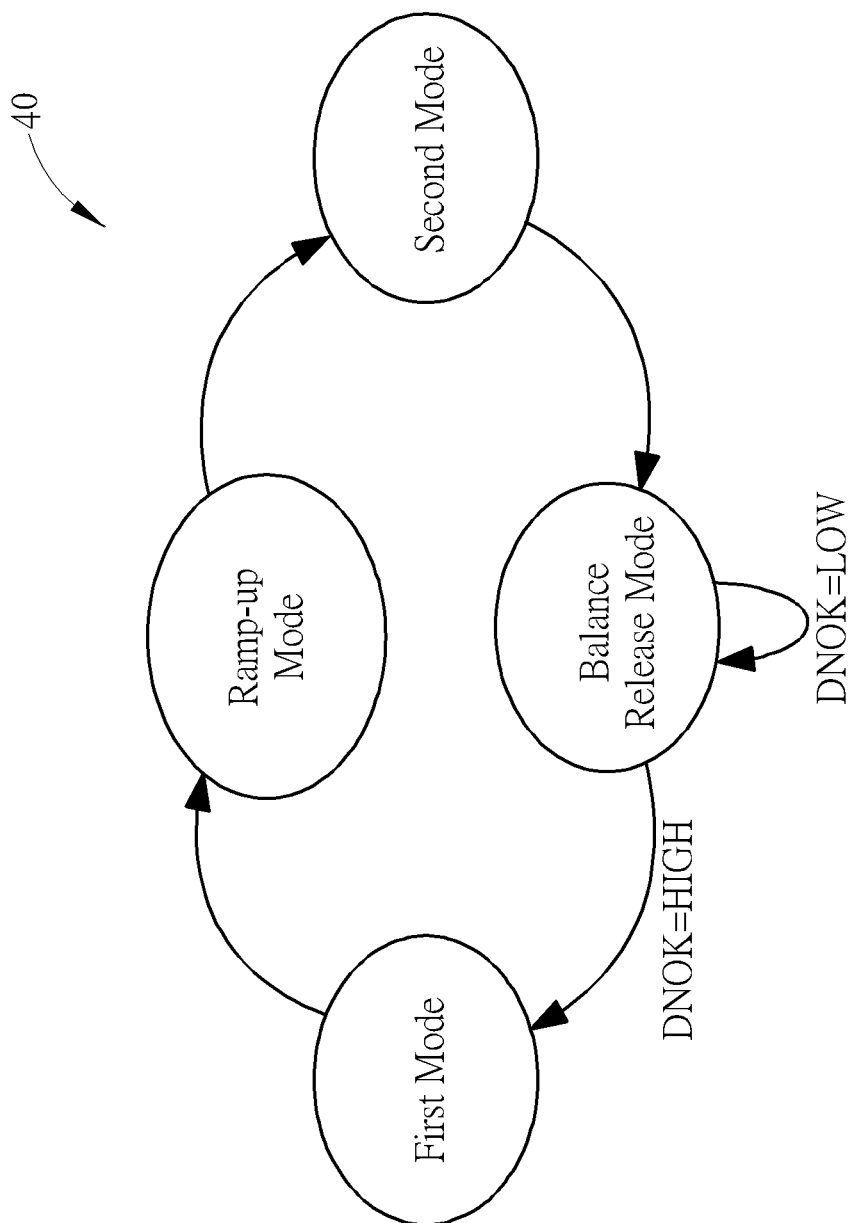
FIG. 4 is a schematic diagram of a mode transformation of a charge pump circuit according to an embodiment of the present application.

As can be known from the above controlling method 30, the charge pump circuit 20 is configured to operate among the first mode, the ramp-up mode, the second mode and the balance release mode by the switch module 202, the digital control circuit 204 and the balance release circuit 208. Please refer to FIG. 4, which is a schematic diagram of a mode transformation 40 of the charge pump circuit 20 according to an embodiment of the present application. As shown in FIG. 4, the charge pump circuit 20 is transformed from the first mode to the ramp-up mode, from the ramp-up mode to the second mode and from the second mode to the balance release mode by the digital control, and transformed from the balance release mode to the first mode according to the logic signal DNOK (DNOK=HIGH).

In detail, the charge pump circuit 20 generates the first output voltage HPVDD and the second output voltage HPVSS with three different phases by switching the switches S1-S6 and the soft ramp-up switch $S1_{soft}$ of the switch module 202. When the charge pump circuit 20 is going to perform the mode transformation, in step 304, the switches S1-S6 are stopped switching to enter the ramp-up mode. In the meantime, the first output voltage HPVDD is adjusted to the voltage level of the input voltage VDD according to the up reference voltage $VR_{UP}$, and the second output voltage HPVSS is adjusted to the ground voltage level GND according to the down reference voltage $VR_{DN}$. Notably, since the up reference voltage $VR_{UP}$ is generated by the up digital signal $D_{UP}$ and the down reference voltage $VR_{DN}$ is generated by the down digital signal $D_{DN}$, the variation speeds of the first output voltage HPVDD and the second output voltage HPVSS are dynamically varied in time with the input signal of the class-G amplifier circuit 10.

In step 306, when the charge pump circuit 20 is transformed from the ramp-up mode to the second mode, the transistor switches $M_{UP}$, $M_{DN}$ are turned on to connect to the input voltage VDD and the ground voltage level GND and enter the second mode. In this step, the first output voltage HPVDD and the second output voltage HPVSS are only related to the up reference voltage $VR_{UP}$ and the down reference voltage $VR_{DN}$. The up reference voltage $VR_{UP}$ and the down reference voltage $VR_{DN}$ are controlled by the up digital signal $D_{UP}$ and the down digital signal $D_{DN}$ of the charge pump controller 206. Therefore, in step 306 of the mode transformation process, larger inrush currents caused by a huge voltage difference of loading resistor RL or bias of the output capacitors $C_{UP}$, $C_{DN}$ would not be generated by the charge pump circuit 20. In addition, since the digital control circuit 204 is connected to the first output voltage HPVDD and the second output voltage HPVSS, the digital control circuit 204 may precisely predict the first output voltage HPVDD and the second output voltage HPVSS of the switch module 202. Therefore, based on the variation speed of the input signal (i.e. the up digital signal $D_{UP}$ and the down digital signal $D_{DN}$) of the charge pump circuit 20, the first output voltage HPVDD and the second output voltage HPVSS are adaptively changed in time, so as to reduce the inrush currents without clipping of the output of the class-G amplifier circuit 10.

Then, in step 308, the charge pump circuit 20 is transformed from the second mode to the balance release mode, the switching operation of the switches S1-S6 is stopped, and the switch $S_{BR}$ is turned on, such that the loading resistor RL and the capacitors $C_{UP}$, $C_{DN}$ discharge the first output voltage HPVDD, and charge the second output voltage HPVSS. Then, the common mode voltage of the first output voltage HPVDD and the second output voltage HPVSS is maintained at $V_{cm}$ (i.e. VDD/2) by the common mode feedback loop of the balance release circuit 208.

Finally, in step 310, when the first output voltage HPVDD is determined smaller than 2*VDD/3 or when the second output voltage HPVSS is determined larger than VDD/3 by the logic circuit LC, the voltage level of the logic signal DNOK is changed. The charge pump circuit 20 is transformed from the balance release mode to the first mode according to the variation of the voltage level of the logic signal DNOK, e.g. from the low voltage level to the high voltage level, and the charge pump controller 206 is notified by the logic signal DNOK.

Since the energy stored in the capacitors $C_{UP}$, $C_{DN}$ may be completely released on the loading resistor RL in step 308, the efficiency of the class-G amplifier circuit 10 may be improved. In addition, when capacitance values of the capacitors $C_{UP}$, $C_{DN}$ mismatch, the variation speeds of the first output voltage HPVDD and the second output voltage HPVSS when charging/discharging are not identical, which generates larger inrush currents when the charge pump circuit 20 is transformed to the first mode with only one (i.e. the first output voltage HPVDD or the second output voltage HPVSS) achieving a stable state voltage of the first mode. Therefore, in this embodiment, the common mode voltage of the first output voltage HPVDD and the second output voltage HPVSS is maintained at VDD/2 by the feedback control of the common mode feedback circuit of the balance release circuit 208. In this way, even if the capacitance values of the capacitors $C_{UP}$, $C_{DN}$ mismatch, the stable state voltage of the first mode is achieved and the larger inrush currents are prevented when the charge pump circuit 20 is transformed from the balance release mode to the first mode, the first output voltage HPVDD is 2*VDD/3 and the second output voltage HPVSS is VDD/3.

Table 1 shows a state table of the switches (on/off) of the charge pump circuit 20 in different modes:

TABLE 1

| | Phase | $S1_{soft}$ | S1 | S2 | S3 | S4 | S5 | S6 | S7 | S8 | S9 | $S_{BR}$ |
|---|---|---|---|---|---|---|---|---|---|---|---|---|
| First Mode | 1 | off | on | off | on | off | off | off | on | off | off | off |
| | 2 | off | off | on | off | off | on | off | on | off | off | off |
| | 3 | off | off | off | off | on | off | on | on | off | off | off |
| Ramp-up Mode | | off | off | on | off | off | on | off | off | off | on | off |
| Second Mode | | off | off | on | off | off | on | off | off | on | off | off |
| Balance Release Mode | | off | off | on | off | off | on | off | on | off | off | on |

Notably, the embodiments mentioned above are to briefly illustrate concepts of the present application, and those skilled in the art may make modifications thereto. For example, the switches mentioned above may be implemented by transistor switches or other switches, or the logic circuit may be implemented by other circuits with the same function and not limited thereto, which all belong to the scope of the present application.

In summary, during the mode transformation, the charge pump circuit of the present application locks the output voltage according to the input signal and adaptively changes the mode transformation speed according to the input signal so as to reduce the inrush currents, avoid circumstances of distortions generated by pop noises or clipping and optimize the efficiency of the amplifier.

The descriptions mentioned above are some of embodiments of the present application and not limited thereto, modifications equivalent substitutions and improvements within the spirit and principle of the present application are all included in the scope of the present application.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A digital control circuit, configured to receive a up digital signal and a down digital signal, and adjust a first output voltage to a voltage level of an input voltage and adjust an second output voltage to a ground voltage level according to the up digital signal and the down digital signal, comprising:
   a digital-to-analog converter (DAC), configured to generate a corresponding up reference voltage and a corresponding down reference voltage according to the up digital signal and the down digital signal; and
   a voltage follower, comprising a plurality of operational amplifiers and a plurality of transistor switches, configured to lock the first output voltage and the second output voltage according to the up reference voltage and the down reference voltage;
   wherein the up digital signal and the down digital signal are varied with time.

2. A charge pump circuit, comprising:
   a digital control circuit, coupled to a switch module of the charge pump, configured to receive a up digital signal and a down digital signal, and adjust a first output voltage to a voltage level of an input voltage and adjust an second output voltage to a ground voltage level according to the up digital signal and the down digital signal, comprising:
      a digital-to-analog converter (DAC), configured to generate a corresponding up reference voltage and a corresponding down reference voltage according to the up digital signal and the down digital signal; and
      a voltage follower, comprising a plurality of operational amplifiers and a plurality of transistor switches, configured to lock the first output voltage and the second output voltage according to the up reference voltage and the down reference voltage.

3. The charge pump circuit of claim 2, further comprising:
   a balance release circuit, coupled to the digital control circuit and the switch module, configured to maintain a common mode voltage of the first output voltage and the second output voltage at a fixed value through a common mode feedback loop, when the first output voltage and the second output voltage is discharging or charging;
   wherein the common mode voltage is half of the input voltage;
   wherein the common mode feedback loop includes a plurality of operational amplifiers and a plurality of resistors.

4. The charge pump circuit of claim 3, wherein the switch module, comprises a plurality of switches, a plurality of output capacitors, a loading resistor and a soft ramp-up switch, and is configured to generate the first output voltage and the second output voltage according to the input voltage and control the plurality of switches and the soft ramp-up switch to transform the first output voltage and the second output voltage with a first mode, a ramp-up mode, a second mode and a balance release mode.

5. The charge pump circuit of claim 4, wherein when the charge pump circuit is transformed from the first mode to the ramp-up mode, the first output voltage is adjusted to the voltage level of the input voltage according to the up reference voltage and the second output voltage is adjusted to the ground voltage level according to the down reference voltage.

6. The charge pump circuit of claim 4, wherein when the charge pump circuit is transformed from the ramp-up mode to the second mode, the plurality of transistor switches of the digital control circuit are turned on to connect the input voltage and the ground voltage level to enter the second mode.

7. The charge pump circuit of claim 6, wherein the first output voltage and the second output voltage are only related to the up reference voltage and the down reference voltage.

8. The charge pump circuit of claim 6, wherein the digital control circuit is connected to the first output voltage and the second output voltage.

9. The charge pump circuit of claim 4, wherein when the charge pump circuit is transformed from the second mode to the balance release mode, the first output voltage is discharged and the second output voltage is charged by the loading resistor and the plurality of capacitors, the common mode voltage of the first output voltage and the second output voltage is maintained at the fixed value by the common mode feedback loop of the balance release circuit.

10. The charge pump circuit of claim 9, wherein when the charge pump circuit is transformed from the second mode to the balance release mode, a switching operation of the plurality of switches of the switch module is stopped, and a switch of the common mode feedback loop is turned on.

11. The charge pump circuit of claim 10, wherein the fixed value is half of the input voltage.

12. The charge pump circuit of claim 4, wherein when the first output voltage and the second output voltage are completely discharged, the charge pump circuit is transformed from the balance release mode to the first mode.

13. The charge pump circuit of claim 12, wherein when the first output voltage is determined smaller than $2/3$ of the input voltage or when the second output voltage is determined larger than $1/3$ of the input voltage by a logic circuit, a voltage level of a logic signal is changed; the charge pump circuit is transformed from the balance release mode to the first mode according to a variation of the voltage level of the logic signal; and a charge pump controller is notified by the logic signal.

14. The charge pump circuit of claim 13, wherein the charge pump controller is configured to output the up digital signal and the down digital signal.

15. The charge pump circuit of claim 12, wherein when the charge pump circuit is transformed from the balance release mode to the first mode, the first output voltage is $2/3$ of the input voltage and the second output voltage HPVSS is $1/3$ of the input voltage, so as to achieve a stable state voltage of the first mode.

16. A controlling method for a charge pump circuit, comprising:
receiving a up digital signal and a down digital signal;
converting the up digital signal and the down digital signal to a up reference voltage and a down reference voltage;
adjusting a first output voltage to a voltage level of an input voltage and an second output voltage to a ground voltage level according to the up reference voltage and the down reference voltage;
turning on a plurality of transistor switches of the digital control circuit of the charge pump circuit to connect the input voltage and a ground voltage level;
discharging the first output voltage and charging the second output voltage; and
maintaining a common mode voltage of the first output voltage and the second output voltage at a fixed value by a common mode feedback loop.

17. The charge pump circuit of claim 16, wherein when the first output voltage is smaller than $2/3$ of the input voltage or when the second output voltage is larger than $1/3$ of the input voltage, the first output voltage and the second output voltage are completely discharged or charged.

18. The charge pump circuit of claim 16, wherein when the first output voltage is determined smaller than $2/3$ of the input voltage or when the second output voltage is determined larger than $1/3$ of the input voltage, a voltage level of a logic signal is changed and a charge pump controller is notified by the logic signal.

19. The charge pump circuit of claim 16, wherein the common mode feedback loop includes a plurality of operational amplifiers and a plurality of resistors.

20. The charge pump circuit of claim 16, wherein the first output voltage is discharged and the second output voltage is charged by a loading resistor and a plurality of capacitors.

* * * * *